(12) United States Patent
Yaung et al.

(10) Patent No.: US 7,326,588 B2
(45) Date of Patent: Feb. 5, 2008

(54) IMAGE SENSOR WITH LIGHT GUIDES

(75) Inventors: Dun-Nian Yaung, Taipei (TW); Chung-Yi Yu, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 318 days.

(21) Appl. No.: 11/229,655

(22) Filed: Sep. 20, 2005

(65) Prior Publication Data

US 2006/0014314 A1 Jan. 19, 2006

Related U.S. Application Data

(62) Division of application No. 10/728,757, filed on Dec. 8, 2003, now Pat. No. 6,969,899.

(51) Int. Cl.
*H01L 21/00* (2006.01)

(52) U.S. Cl. .............................. 438/57; 438/60; 438/66; 438/73

(58) Field of Classification Search .................. 438/57, 438/75
See application file for complete search history.

(56) References Cited

U.S. PATENT DOCUMENTS

| | | |
|---|---|---|
| 4,914,301 A | 4/1990 | Akai |
| 4,982,096 A | 1/1991 | Fujii et al. |
| 5,430,298 A | 7/1995 | Possin et al. |
| 5,583,354 A | 12/1996 | Ishibe |
| 5,796,154 A | 8/1998 | Sano et al. |
| 5,994,751 A | 11/1999 | Oppermann |
| 6,001,540 A | 12/1999 | Huang et al. |
| 6,130,422 A | 10/2000 | Bawolek et al. |
| 6,246,081 B1 | 6/2001 | Abe |
| 6,362,513 B2 | 3/2002 | Wester |
| 6,379,992 B2 | 4/2002 | Jo |
| 6,452,186 B1 | 9/2002 | Wieczorek et al. |
| 6,482,669 B1 | 11/2002 | Fan et al. |
| 6,518,640 B2 | 2/2003 | Suzuki et al. |
| 6,800,838 B2 | 10/2004 | Yamamoto |
| 7,061,028 B2 * | 6/2006 | Yaung et al. ............... 257/208 |
| 2005/0274871 A1 * | 12/2005 | Li et al. .................. 250/208.1 |
| 2006/0073629 A1 * | 4/2006 | Yaung et al. ................. 438/66 |

* cited by examiner

*Primary Examiner*—Jack Chen
(74) *Attorney, Agent, or Firm*—Birch, Stewart, Kolasch & Birch, LLP

(57) ABSTRACT

An image sensor device and fabrication method thereof. An image sensing array is formed in a substrate, wherein the image sensing array comprises a plurality of photosensors with spaces therebetween. A first dielectric layer with a first refractive index is formed overlying the spaces but not the photosensors. A conformal second dielectric layer with a second refractive index is formed on a sidewall of the first dielectric layer. A third dielectric layer with a third refractive index is formed overlying the photosensors but not the spaces. The third refractive index is greater than the second refractive index. A light guide constructed by the second and third dielectric layers is formed overlying each photosensor, thereby preventing incident light from striking other photosensors.

27 Claims, 6 Drawing Sheets

IMAGE SENSOR WITH LIGHT GUIDES

CROSS-REFERENCE TO RELATED APPLICATIONS

This application is a Divisional of application Ser. No. 10/728,757, filed on Dec. 8, 2003, now U.S. Pat. No. 6,969,899 and for which priority is claimed under 35 U.S.C. § 120, the entire contents of which are hereby incorporated by reference.

BACKGROUND OF THE INVENTION

1. Field of the Invention

The present invention relates to a method of forming an image sensor device, and more particularly, to a method of forming light guides of an image sensor device to eliminate crosstalk between pixels.

2. Description of the Related Art

Light imaging array devices are used in a wide variety of applications. These devices utilize an array of active pixels or image sensor cells, comprised with photodiode elements, to collect photon energy to convert images into streams of digital data.

In FIG. 1A, a traditional image sensor device is illustrated in cross section. The device comprises a semiconductor substrate 10 having an array of photodiodes formed therein. Each photodiode comprises, for example, an n-type region 15 in a p-type region 20. Each photodiode is separated from other photodiodes by an array of isolation structures 25, such as shallow trench isolation (STI). Thus, an array of pixels is obtained. The pixels convert incoming light 30 and 34 from a light/image source 38 into electrical signals via the photodiodes.

In order to achieve miniaturization, the pixel size is decreased and a multilevel interconnect structure is employed. For instance, the substrate 10 is covered by a series of dielectric layers, such as an interlevel dielectric (ILD) layer 40 and intermetal dielectric (IMD) layers 50 and 55. Further, a wire pattern of interconnects (not shown) and metal lines 60 and 62 are formed in the IMD layers 50 and 55.

Incident light 30 and 34 will strike the surface of the top most dielectric layer 55. This light will then be transmitted through the underlying dielectric layers 55, 50 and 40 down to the underlying pixels. It is a common occurrence for the incident light 30 and 34 to strike the surface of the photodiode device at a variety of angles. For example, the light 30 strikes the surface at a near perpendicular angle, and the light 34 strikes the surface at a non-perpendicular angle.

The light 30 that strikes the surface at a near perpendicular angle is transmitted to a photodiode 70 (a pixel) underlying the strike location. This is optimal for image sensing performance. However, the light 34 that strikes the surface at a non-perpendicular angle may then be transmitted to a nearby photodiode 72 rather than to the pixel 70 directly underlying the strike surface. This effect is called crosstalk. During a crosstalk event, the light 34 falls on the incorrect photodiode 72 rather than the intended photodiode 70 due to light scattering. The light scattering problem causes degraded image resolution for black and white sensors or complicated color correction for color sensors.

In some prior art sensor arrays, multiple layers of metal lines 60 and 62 are used to create metal shields, as shown in FIG. 1A. These metal shields are designed to suppress light scattering between adjacent pixels. Use of metal shields, however, requires that the metal lines 60 and 62 be isolated, and this limitation requires increased pixel size.

Referring to FIG. 11B, an image sensor device having light guides has recently been disclosed by Taiwan Semiconductor Manufacturing Company (TSMC). First dielectric layers 80 having a lower refractive index (R.I.) are formed over the substrate 10. A hole 90 is then defined in the first dielectric layers 80, wherein the hole 90 is located above a photodiode 70. The hole 90 is then filled with a second dielectric layer 92 having a relatively greater refractive index to form a light guide 95. The light guide 95, based on the total reflection theorem, prevents light scattering (or crosstalk) from occurring.

Nevertheless, the requirement of different refractive indexes between the first dielectric layer 80 and the second dielectric layer 92 limits the selection of the dielectric materials thereof. Moreover, when an IMD layer having multi-dielectric films (e.g. SiON, FSG and SiN) is utilized, the material selection is more difficult. The formation of light guides without concern to the relation between the first dielectric layer 80 and the second dielectric layer 92 is a goal of the present invention.

In U.S. Pat. No. 6,130,422, Edward et al disclose a method to improve the quantum efficiency (QE) of an image sensor. The image sensor comprises a photodiode and a dielectric structure. The photodiode is responsive to an amount of incident light from a light source. The dielectric structure is on top of the photodiode and is placed between the photodiode and an interlevel dielectric (ILD) oxide layer. The dielectric structure contains a nitride material. The ILD oxide layer is made of an oxide material and has an ILD oxide thickness. Nevertheless, this method does not disclose a light guide in the dielectric layers.

In U.S. Pat. No. 6,482,669, Fan et al disclose a method to improve the light collection efficiency of an image sensor. This method forms a high transmittance overcoat layer with a flat top surface upon the color filter, wherein the refractive index of the overcoat layer approximates that of the color filter. Nevertheless, this method does not disclose a light guide in the dielectric layers.

In U.S. Pat. No. 6,001,540, Huang et al disclose a CCD-based imaging array. This method uses the LOCOS process to form a microlens. The light shield structure of the array comprises a layer of WSi. The light shield structures are formed over the CCD structures which surround the photodiodes. Nevertheless, this method does not disclose a light guide for an image sensor.

SUMMARY OF THE INVENTION

The object of the present invention is to provide an image sensor device and fabrication method thereof.

Another object of the present invention is to provide a method of forming an image sensor having light guides.

Yet another object of the present invention is to provide a method of forming an image sensor having light guides and a dielectric layer, wherein the dielectric layer is a multi-dielectric structure.

In order to achieve these objects, the present invention provides an image sensor device. An image sensing array is formed in a substrate, wherein the image sensing array comprises a plurality of photosensors with spaces therebetween. A first dielectric layer is formed overlying the spaces but not the photosensors. A conformal second dielectric layer is formed on a sidewall of the first dielectric layer, wherein the second dielectric layer has a second refractive index. A third dielectric layer is formed overlying the photosensors but not the spaces, wherein the third dielectric layer has a third refractive index. The third refractive index is greater than the second refractive index. A light guide constructed by the second and third dielectric layers is formed overlying each photosensor, thereby preventing incident light from striking other photosensors.

The present invention also provides a method of forming an image sensor device. An image sensing array is formed in a substrate, wherein the image sensing array comprises a plurality of photosensors with spaces therebetween. A first dielectric layer of a multi-dielectric structure is formed overlying the photosensors and the spaces. The first dielectric layer is patterned by removing part of the first dielectric layer to form an opening above each photosensor while maintaining the first dielectric layer overlying the spaces. A dielectric layer is formed on the first dielectric layer and an inner surface of the opening. Part of the dielectric layer is anisotropically etched back to form a conformal second dielectric layer on the sidewall of the opening, wherein the second dielectric layer has a second refractive index. A third dielectric layer is formed overlying the first dielectric layer, the second dielectric layer and the opening, wherein the third dielectric layer has a third refractive index. Part of the third dielectric layer is removed to the first dielectric layer while maintaining the third dielectric layer in the opening. The third refractive index is greater than the second refractive index. Thus, a light guide comprising the second dielectric layer and the third dielectric layer is formed overlying each photosensor, thereby preventing incident light from striking other photosensors.

The present invention improves on the prior art in that the image sensor device has a light guide comprising the second dielectric layer and the third dielectric layer overlying each photosensor. Thus, the light guide prevents incident light from striking other photosensors. In addition, the material selection for the IMD layer is less limited as there is no relation between the first dielectric layer and the third dielectric layer. The light guide of the present invention can avoid light scattering between adjacent pixels, thereby reducing crosstalk and ameliorating the disadvantages of the prior art.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become be more fully understood from the detailed description given hereinbelow and the accompanying drawings, which are given by way of illustration only, and thus are not limitative of the present invention, and wherein.

DETAILED DESCRIPTION OF THE INVENTION

The present invention provides an image sensor device and fabrication method thereof. The image sensor device is very suitable for a solid state image sensor, such as a CCD (charge-coupled device) or a CMOS (complementary metal-oxide semiconductor) imager. In order to simplify the illustration, a representative photodiode array serving as a photosensor array is illustrated in the preferred embodiment of the present invention; the peripheral regions of the image sensor device are not illustrated.

FIGS. 2~9 illustrate a process of manufacturing a modified image sensor device of the present invention. FIG. 10 illustrates the improved performance of the preferred embodiment of the present invention. Several important features of the present invention are shown therein and discussed below. The embodiments of the present invention are applied to the formation of a unique, image sensor array comprising a plurality of photodiodes (i.e. photosensors) formed in a semiconductor substrate. The teachings may be further applied to any form of image sensing array.

Figure 1A:
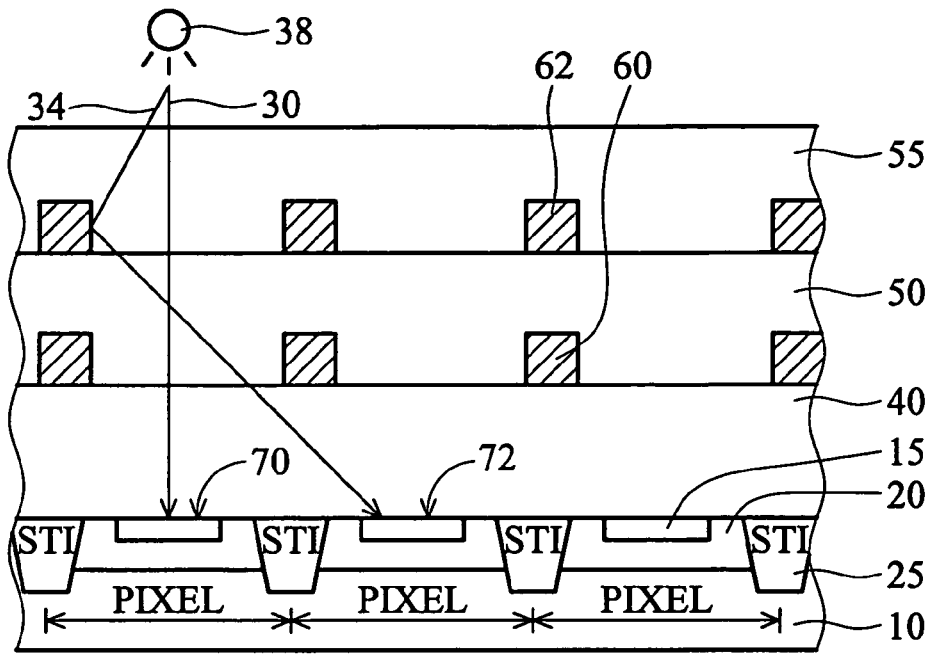
FIG. 1A illustrates a traditional image sensor device, in cross section, showing the problem of light scattering between adjacent pixels in the image sensing array.
Figure 1B:
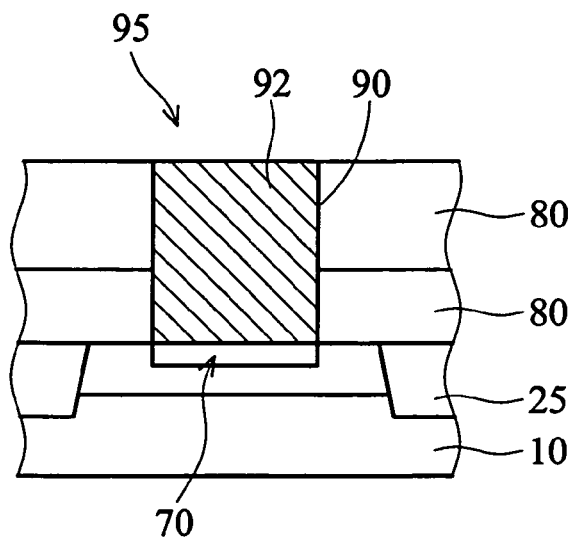
FIG. 1B is a sectional view showing an image sensor device having light guides recently disclosed by Taiwan Semiconductor Manufacturing Company.
Figure 2:
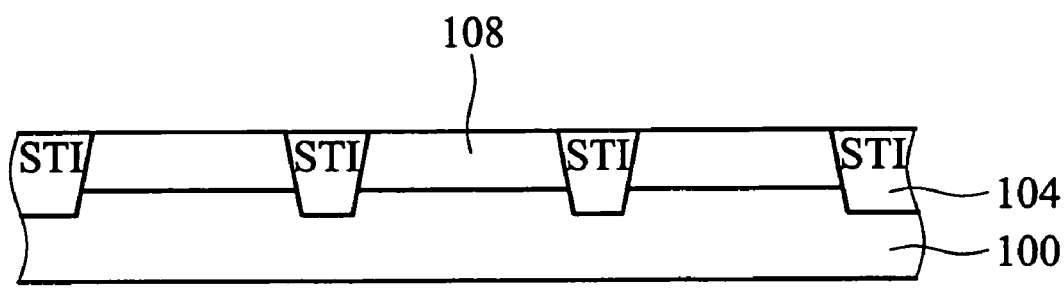
FIGS. 2~9 are sectional views, according to a method of manufacturing a modified image sensor device of the present invention.

In FIG. 2, a semiconductor substrate 100 is provided. The semiconductor substrate 100 may be a monocrystalline silicon substrate or a P-type substrate comprised of single crystalline silicon with a <100> crystallographic orientation. The substrate 100 is divided into a predetermined array of pixel regions (not symbolized) and isolation regions 104, wherein any isolation region 104 is between the adjacent pixel regions. The isolation regions 104 can be shallow trench isolation (STI) structures formed by known isolation techniques. P well regions 108 (serving as diode wells) are next formed in a top portion of the substrate 100 and in the pixel regions, via implantation of boron or $BF_2$ ions, for example, at energy between about 70 to 120 KeV, at a dose between about 1E12 to 1E13 atoms/cm$^2$.

Figure 3:
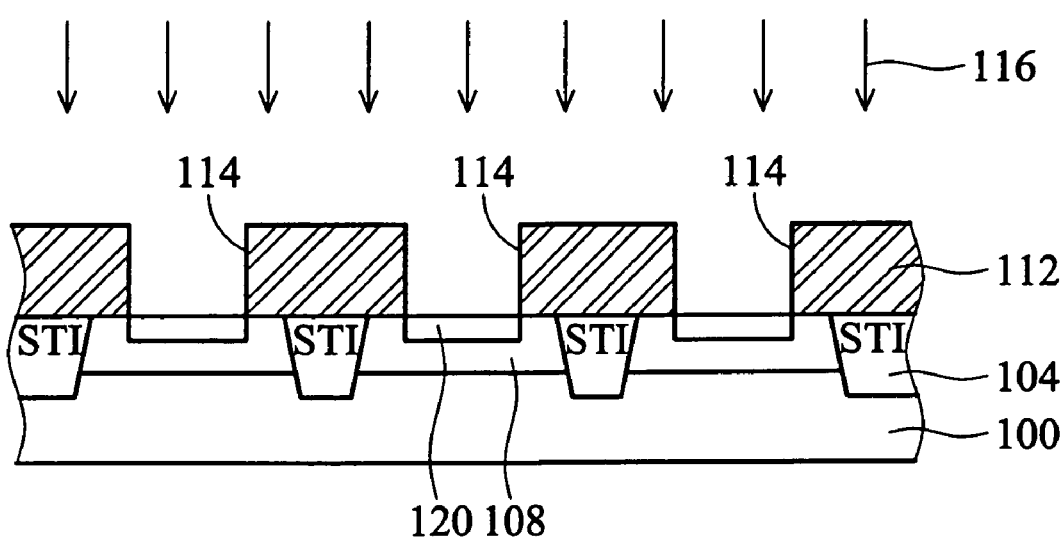

In FIG. 3, a patterned photoresist layer 112 is formed on part of the substrate 100. The photoresist layer 112 has openings 114 exposing a portion of the top surface of the P well regions 108. An ion implantation 116, using arsenic or phosphorous ions, is next performed to form N-type regions 120 in part of the P well regions 108, wherein the N-type regions 120 serve as sensing areas 120 of the photodiodes (or pixels). For example, the operational conditions of the ion implantation 116 comprise an energy between about 50 to 180 KeV and a dose between about 1E13 to 5E15 atoms/cm$^2$. The photoresist layer 112 is then removed by plasma oxygen ashing and careful wet cleaning. This ion implantation 116, plus any annealing or activation treatment, completes the array of photodiodes 108 (the P well regions) and 120 (N-type regions/sensing areas). Note that the isolation region 104 has been formed between each photodiode. Therefore, the array actually comprises a plurality of photodiodes with spaces 104 (the isolation regions) therebetween.

Figure 4:
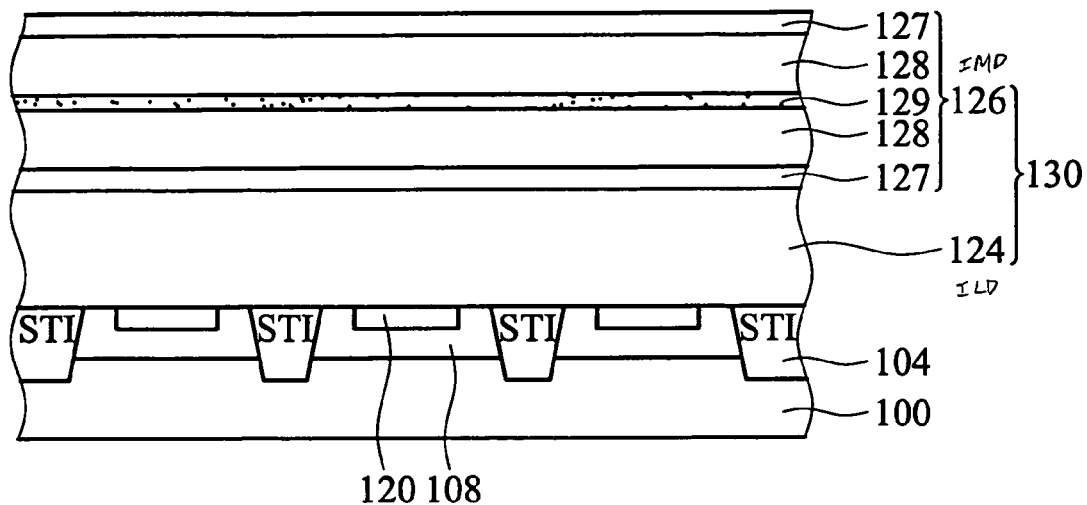

In FIG. 4, at least one interlevel dielectric (ILD) layer 124 and at least one intermetal dielectric (IMD) layer 126 of a multi-dielectric structure are sequentially formed overlying the array of photodiodes 108 and 120 and the spaces 104. The ILD layer 124 can be a silicon oxide or BPSG (boro-phosphosilicate glass) layer formed by LPCVD or PECVD procedure, at a thickness between about 6000 to 14000 Å. Referring to FIG. 4, the multi-dielectric structure can comprise multiple dielectric films. For example, the IMD layer 126 comprises SiON films 127 (R.I. is about 1.6~1.7), FSG (Fluorinated Silica Glass) films 128 (R.I. is about 1.435) and an interlaminated SiN film 129 (R.I. is about 1.9~2.0) serving as an etch stop, diffusion barrier, etc. It should be noted that the IMD layer 126 with multiple dielectric films has been widely used in interconnect and damascene processes to isolate a plurality of metal levels in an IC device. Since the multiple dielectric films 127, 128 and 129 have different refractive indexes, the light guide 95 of the prior art is difficult to operate coordinately (that is, the total reflection effect cannot thoroughly occur in the light guide 95 of the prior art). Thus, the formation of the IMD layer and light guide without concern to each other is the goal of the present invention.

In order to simplify the illustration of the present invention, the ILD layer 124 and the IMD layer 126 are to be generally a first dielectric layer 130 having a first refractive index in this embodiment. The first dielectric layer 130 is then performed by planarization (e.g. a CMP process) to obtain a smooth surface. It should be noted that the first dielectric layer 130 can comprise multiple levels. For example, if the device was fabricated using three metal level processes, then the separated IMD layer 126 would exist for each of the three metal levels (not shown). Since metal levels exist in the IMD layer 126, passage of the upper light through the IMD layer 126 is limited. In order to simplify the illustration of the present invention, only one IMD layer 126 is shown in FIGS. 4~10, but is not intended to limit the present invention.

Figure 5:
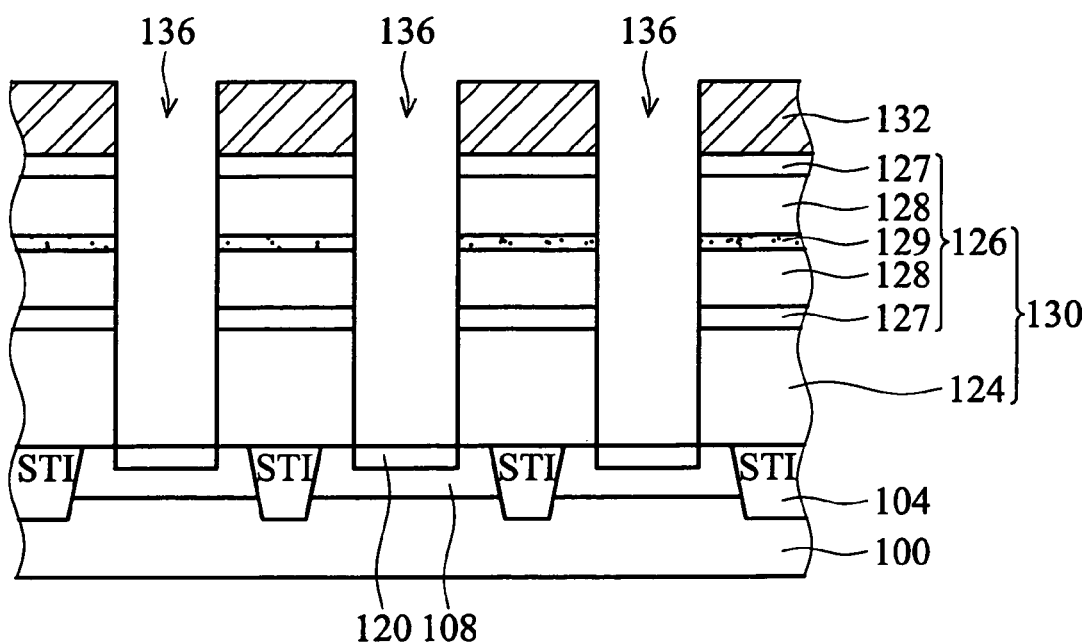

In FIG. 5, a patterned photoresist layer 132 is formed on the first dielectric layer 130. Using the photoresist layer 132 as a mask, part of the first dielectric layer 130 is removed to form an opening 136 above each the N-type regions 120 while maintaining the first dielectric layer 130 overlying the spaces 104 (and can also overlying part of the P wells 108). The step of patterning the first dielectric layer 130 can use the same reticle that is used for defining the N-type regions 120 for the photodiodes. In this embodiment, the opening 136 exposes the top surface of the N-type region 120. The photoresist layer 132 is then removed by plasma oxygen ashing and careful wet cleaning.

Figure 6:
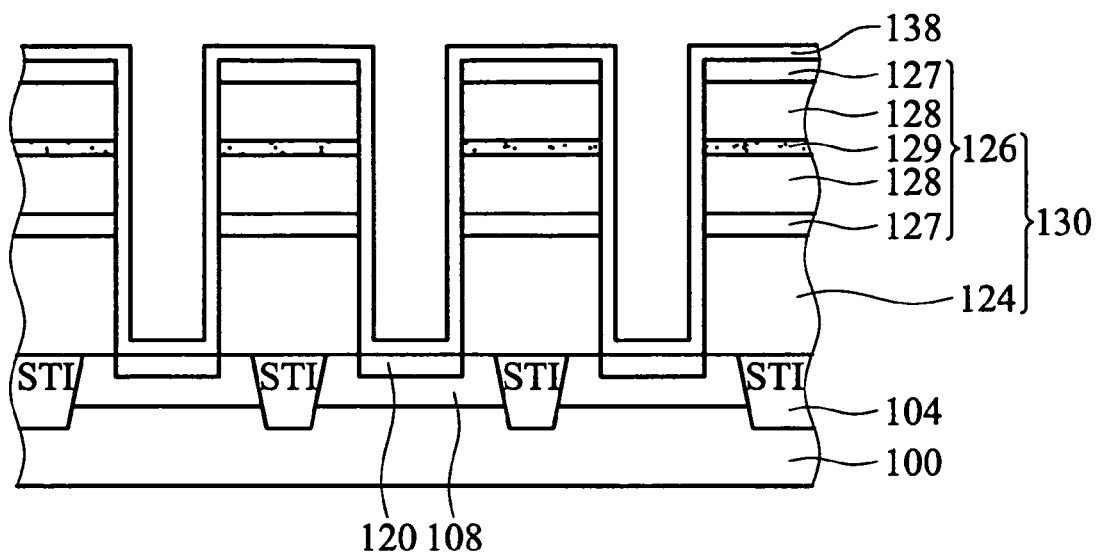

In FIG. 6, an important feature of the present invention is illustrated. A conformal dielectric layer 138 is formed on the first dielectric layer 130 and an inner surface of the opening 136 by, for example, deposition or coating. The dielectric layer 130 is made of dielectric material with low-k and low-R.I. (e.g. R.I. is about 1.35 or less), such as FLARE, SiLK, FLAC (fluorinated amorphous silicon), fluoro polymer, porous silica, or the like.

Figure 7:
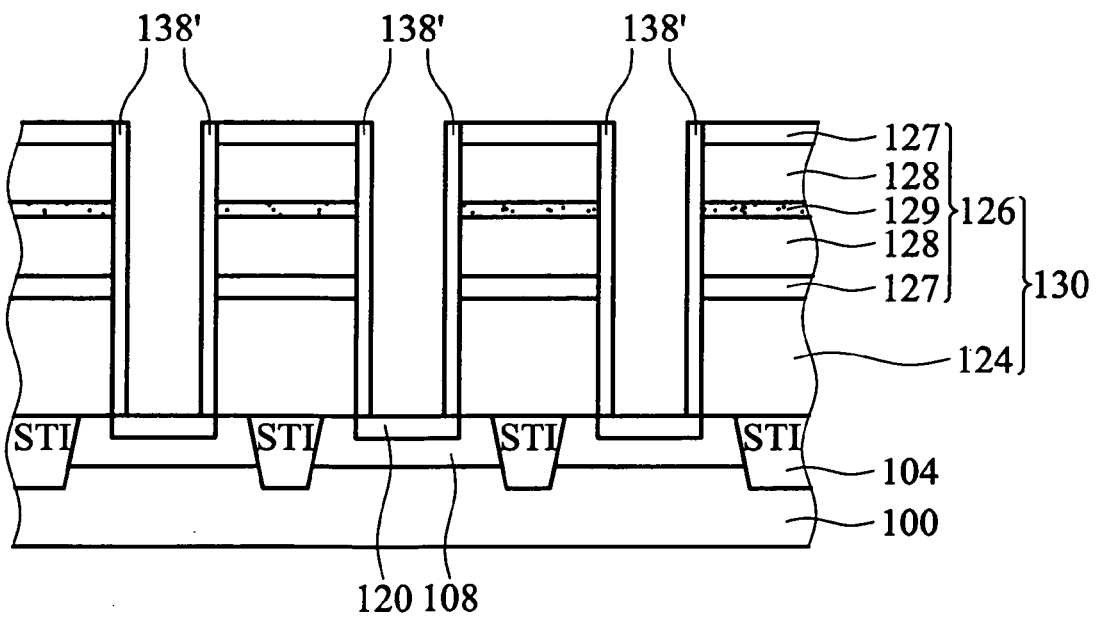

In FIG. 7, part of the dielectric layer 138 is then anisotropically etched back to form a conformal second dielectric layer 138' on the sidewall of the opening 136, wherein the second dielectric layer 138' has a second refractive index. The anisotropic etching can be dry etching. The thickness of the second dielectric layer 138' is between about 200 to 2000 Å. In this example, the first refractive index is greater than the second refractive index.

Figure 8:
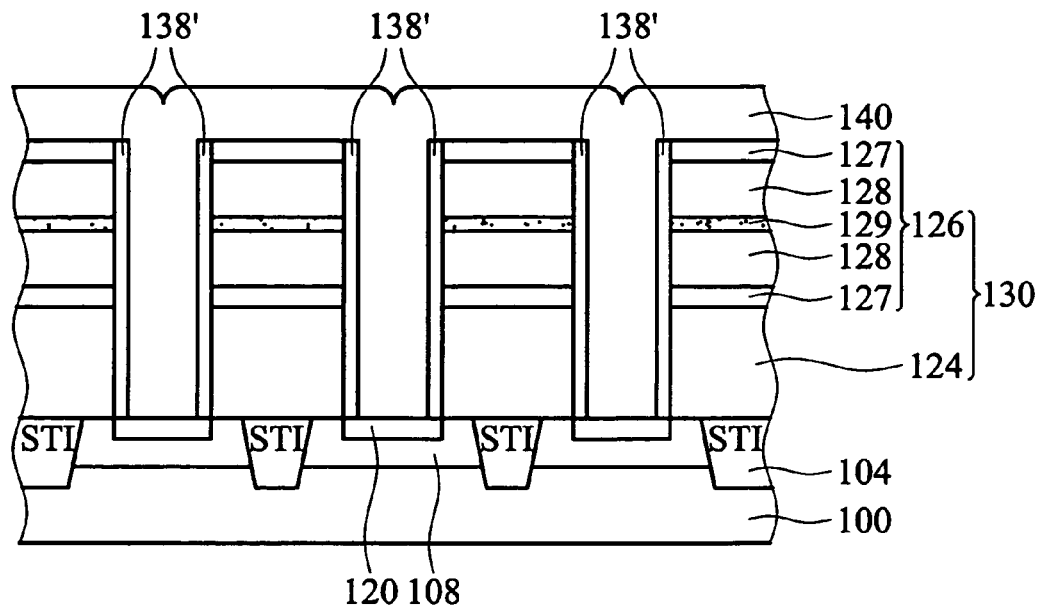

In FIG. 8, a third dielectric layer 140 is formed overlying the first dielectric layer 130, the second dielectric layer 138' and the openings 138'. That is, the openings 138' are filled with the third dielectric layer. The third dielectric layer 140 has a third refractive index. It is important that the third refractive index is greater than the second refractive index and that there is no relation between the first refractive index and the third refractive index. Thus, the IMD material selection of the present invention is more convenient than the prior art. The third dielectric layer 140 is composed of a higher R.I. dielectric material, such as TEOS-SiO$_2$ (R.I. is about 1.46) formed by PECVD. In general, the third refractive index of the third dielectric layer 140 should be greater than the second refractive index of the second dielectric layer 138' by at least 0.1.

Figure 9:
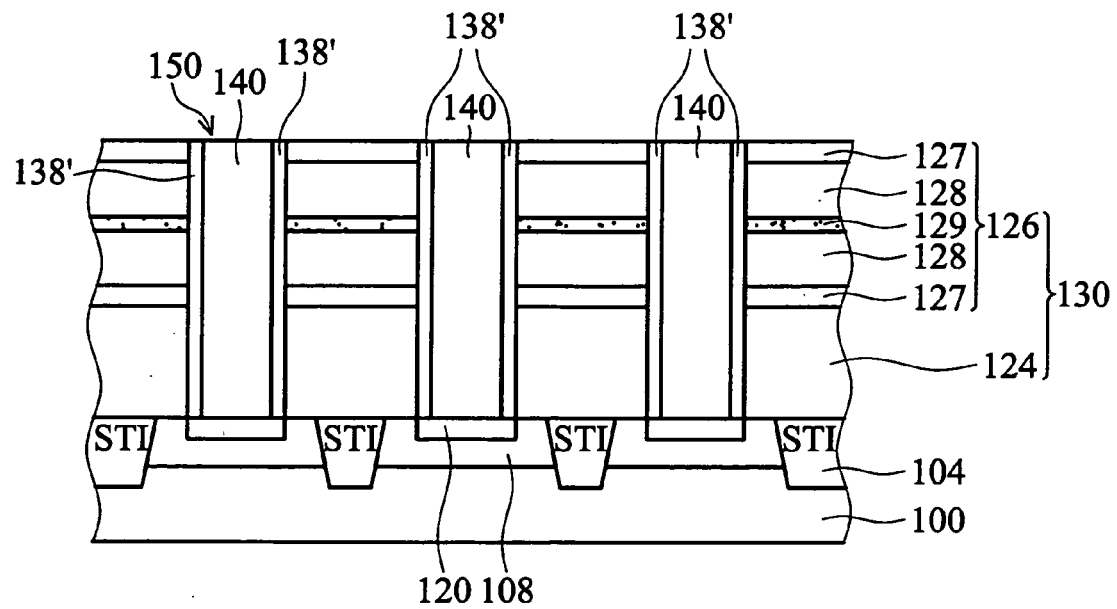
Figure 10:
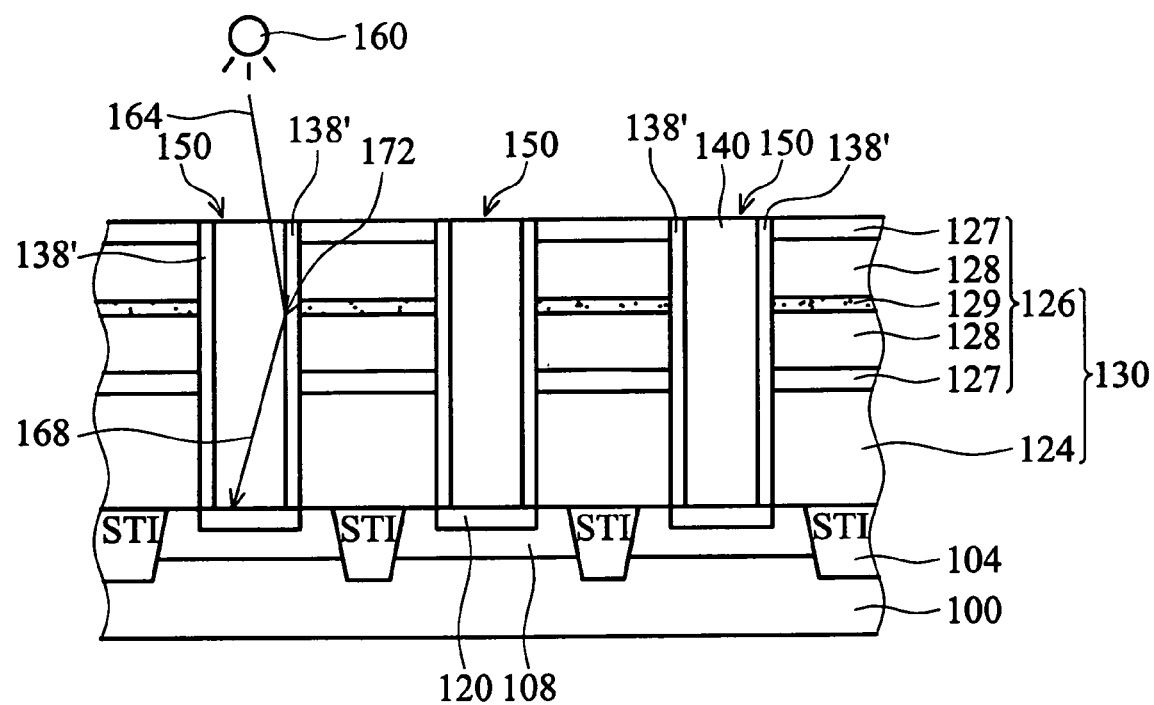
FIG. 10 illustrates the improved performance of the preferred embodiment of the present invention.

In FIG. 9, the third dielectric layer 140 is planarized to the top surface of the first dielectric layer 130 and the second dielectric layer 138' by removing part of the third dielectric layer 140. That is, the top surface of the first dielectric layer 130, the second dielectric layer 138', and the third dielectric layer 140 are coplanar after planarization. This planarizing step may be performed using any planarizing process known in the art. However, the planarizing step preferably comprises CMP (chemical mechanical polishing). This planarizing step completes the formation of unique light guides 150 comprising the second dielectric layer 138' and the third dielectric layer 140 formed overlying the N-type regions or sensing areas 120 of each photodiode.

According to the method of the present invention, a modified image sensor device is obtained. Referring to FIG. 9, an image sensing array is formed in a substrate 100, wherein the image sensing array comprises a plurality of sensing areas 120 (or photodiodes) with spaces 104 therebetween. A first dielectric layer 130 is formed overlying the spaces 104 but not the sensing areas 120, wherein the first dielectric layer 130 has a first refractive index. A conformal second dielectric layer 138' is formed on a sidewall of the first dielectric layer 130, wherein the second dielectric layer has a second refractive index. A third dielectric layer 140 is formed overlying the sensing areas 120 but not the spaces 104, wherein the third dielectric layer has a third refractive index. The third refractive index is greater than the second refractive index. A light guide 150 constructed by the second and third dielectric layers 138' and 140 is formed overlying each sensing area 120.

FIG. 10 illustrates the improved performance of the preferred embodiment of the present invention. Incident light 164 is emitted from a light source 160. The incident light 164 strikes the light guide 150 above a pixel. Further, the incident light 164 strikes the light guide 150 at a non-perpendicular angle and reaches the interface 172 between the second dielectric layer 138' and the third dielectric layer 140. At this interface 172, the incident light 164 will make a transition between the high R.I. material (the third dielectric layer) 140 and the low R.I. material (the second dielectric layer) 138'.

As is well known in the art of optics, the transmission of light across such an interface 172 is governed by Snell's equation:

$$n1 \sin \theta_1 = n2 \sin \theta_2,$$

where, in this case, n1 is the refractive index of the second dielectric layer 138', n2 is the refractive index of the third dielectric layer 140, $\theta_2$ is the incident angle of the light 164 striking the interface 172, and $\theta_1$ is the angle of light transmitted to the second dielectric layer 138'. Further, if the incident light 164 does not strike the interface 172 at a 90° angle, then a part of the light will be reflected back to the third dielectric layer 140. In the case of the present invention, however, it is not possible for the incident light 164 to strike the interface 172 at a 90° angle. Therefore, there must be a reflected light component 168.

A significant feature of the present invention follows. Since the refractive index of the third dielectric layer 140 is greater than that of the second dielectric layer 138', there exists an incident critical angle $\theta_c$. When the incident angle $\theta 2$ is equal or greater than the critical angle $\theta_c$, all of the incident light 164 will be reflected back to the third dielectric layer 140 and none of the light will be transmitted to the second dielectric layer 138' and the first dielectric layer 130. This critical angle $\theta_c$ may be found by setting the transmitted light angle to 90-degree and results in the following equation:

$$\sin \theta_c = n1/n2.$$

Based on the refractive indexes of the optimal materials of the second and third dielectric layers 138' and 140 of this embodiment, the incident light 164 would be totally reflected back to the third dielectric layer 140 if the incident angle $\theta_2$ exceeds about 67°, with respect to the perpendicular angle of the surface of the interface 172. As a result, the reflected light 168 strikes the sensing area 120 underlying the light guide 150 without striking any other the sensing area (or adjacent sensing areas), thereby avoiding crosstalk.

Another important feature is that, according to the present invention, there is no relation between the third dielectric layer 140 and the first dielectric layer 130. That is, the IMD layer 126 with multi-dielectric films can be easily utilized without concern to the coordination with the third dielectric layer 140.

Moreover, microlens elements (not shown) and color filters (not shown) can be formed above the light guides 150 by known techniques. The microlens process is described in, for example, U.S. Pat. No. 6,495,813, and is therefore not discussed herein to avoid obscuring aspects of the present invention.

The present invention provides an image sensor with light guides and its fabricating method. The light guide comprises the second dielectric layer and the third dielectric layer overlying each photosensor, wherein the refractive index of the third dielectric layer is greater than that of the second dielectric layer. Thus, the light guide prevents incident light from striking other photosensors. In addition, the material selection for the IMD layer is less limited as there is no relation between the first dielectric layer and the third dielectric layer. The light guide of the present invention can avoid light scattering between adjacent pixels, thereby reducing crosstalk and ameliorating the disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming an image sensor device, comprising the steps of:
   forming an image sensing array in a substrate, wherein the image sensing array comprises a plurality of photosensors with spaces therebetween;
   forming a first dielectric layer overlying the spaces but not the photosensors;
   forming a conformal second dielectric layer on a sidewall of the first dielectric layer, wherein the second dielectric layer has a second refractive index; and
   forming a third dielectric layer overlying the photosensors but not the spaces, wherein the third dielectric layer has a third refractive index;
   wherein the third refractive index is greater than the second refractive index.

2. The method according to claim 1, wherein the photosensors are photodiodes.

3. The method according to claim 2, wherein the photodiodes comprise n-type regions in p-type regions.

4. The method according to claim 1, wherein the method of forming the first dielectric layer, the second dielectric layer and the third dielectric layer comprises the steps of:
   forming the first dielectric layer overlying the photosensors and the spaces;
   patterning the first dielectric layer by removing part of the first dielectric layer to form an opening above each photosensor while maintaining the first dielectric layer overlying the spaces;
   forming a dielectric layer on the first dielectric layer and an inner surface of the opening;
   anisotropically etched back part of the dielectric layer to form the second dielectric layer on the sidewall of the opening;
   forming the third dielectric layer overlying the first dielectric layer, the second dielectric layer and the opening; and
   removing part of the third dielectric layer to the first dielectric layer while maintaining the third dielectric layer in the opening.

5. The method according to claim 4, wherein the step of patterning the first dielectric layer uses the same reticle that is used for defining ion implantation regions for the photosensors.

6. The method according to claim 4, further comprising the step of:
   performing a planarization to make the top surfaces of the first dielectric layer, the second dielectric layer and the third dielectric layer are coplanar.

7. The method according to claim 6, wherein the planarization comprises chemical mechanical polishing.

8. The method according to claim 1, wherein the first dielectric layer comprises at least
   one interlevel dielectric (ILD) layer.

9. The method according to claim 8, wherein the first dielectric layer further comprises at least one intermetal dielectric (IMD) layer.

10. The method according to claim 9, wherein the IMD layer has multiple dielectric films.

11. The method according to claim 10, wherein the multiple dielectric films comprise SiON, SiN and FSG (Fluorinated Silica Glass) films.

12. The method according to claim 11, wherein the second dielectric layer is a low-k dielectric layer.

13. The method according to claim 12, wherein the low-k dielectric layer is a FLARE, SiLK, FLAC (fluorinated amorphous silicon), fluoro polymer or porous silica layer.

14. The method according to claim 13, wherein the third dielectric layer is a TEOS-SiO$_2$ layer formed by PECVD.

15. The method according to claim 1, wherein the third refractive index is greater than the second refractive index by at least about 0.1.

16. A method of forming an image sensor device, comprising the steps of:
   forming an image sensing array in a substrate, wherein the image sensing array comprises a plurality of photosensors with spaces therebetween;
   forming a first dielectric layer of a multi-dielectric structure overlying the photosensors and the spaces;
   patterning the first dielectric layer by removing part of the first dielectric layer to form an opening above each photosensor while maintaining the first dielectric layer overlying the spaces;

forming a dielectric layer on the first dielectric layer and an inner surface of the opening;

anisotropically etched back part of the dielectric layer to form a conformal second dielectric layer on the sidewall of the opening, wherein the second dielectric layer has a second refractive index;

forming a third dielectric layer overlying the first dielectric layer, the second dielectric layer and the opening, wherein the third dielectric layer has a third refractive index; and removing part of the third dielectric layer to the first dielectric layer while maintaining the third dielectric layer in the opening;

wherein the third refractive index is greater than the second refractive index;

wherein a light guide comprising the second dielectric layer and the third dielectric layer is formed overlying each photosensor, thereby preventing incident light from striking other photosensors.

17. The method according to claim 16, wherein the photosensors are photodiodes.

18. The method according to claim 17, wherein the photodiodes comprise n-type regions in p-type regions.

19. The method according to claim 16, wherein the step of patterning the first dielectric layer uses the same reticle that is used for defining ion implantation regions for the photosensors.

20. The method according to claim 16, further comprising the step of:

performing planarization to make the top surfaces of the first dielectric layer, the second dielectric layer, and the third dielectric layer coplanar.

21. The method according to claim 20, wherein the planarization comprises chemical mechanical polishing.

22. The method according to claim 16, wherein the multi-dielectric structure comprises SiON, SiN and FSG (Fluorinated Silica Glass) films.

23. The method according to claim 22, wherein the second dielectric layer is a low-k dielectric layer.

24. The method according to claim 23, wherein the low-k dielectric layer is a FLARE, SiLK, FLAC (fluorinated amorphous silicon), fluoro polymer or porous silica layer.

25. The method according to claim 24, wherein the third dielectric layer is a TEOS-$SiO_2$ layer formed by PECVD.

26. The method according to claim 16, wherein the third refractive index is greater than the second refractive index by at least about 0.1.

27. The method according to claim 16, wherein a thickness of the second dielectric layer is 200~2000 Å.

* * * * *